(12) United States Patent
Madurawe

(10) Patent No.: US 9,524,994 B2
(45) Date of Patent: Dec. 20, 2016

(54) IMAGE SENSOR PIXELS WITH MULTIPLE COMPARTMENTS

(71) Applicant: SEMICONDUCTOR COMPONENTS INDUSTRIES, LLC, Phoenix, AZ (US)

(72) Inventor: Raminda Madurawe, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/685,909

(22) Filed: Apr. 14, 2015

(65) Prior Publication Data

US 2016/0307945 A1   Oct. 20, 2016

(51) Int. Cl.
   *H01L 27/146* (2006.01)
(52) U.S. Cl.
   CPC ... *H01L 27/14607* (2013.01); *H01L 27/14605* (2013.01); *H01L 27/14643* (2013.01); *H01L 27/14685* (2013.01); *H01L 27/14689* (2013.01)
(58) Field of Classification Search
   CPC ........... H01L 27/1462; H01L 27/14621; H01L 27/1446; H01L 27/14632; H01L 27/14647
   See application file for complete search history.

(56) References Cited

U.S. PATENT DOCUMENTS

| | | | |
|---|---|---|---|
| 5,055,931 A | 10/1991 | Cazaux | |
| 5,382,824 A | 1/1995 | Popovic | |
| 5,970,316 A | 10/1999 | Merrill | |
| 6,559,488 B1 * | 5/2003 | Thomas | H01L 27/1462 257/257 |
| 6,674,679 B1 | 1/2004 | Myasaka | |
| 6,750,523 B2 * | 6/2004 | Blanchard | H01L 27/1446 257/459 |
| 6,784,505 B2 | 8/2004 | Zeng | |
| 6,924,167 B1 * | 8/2005 | Hopper | H01L 27/14647 257/E27.135 |
| 6,930,336 B1 * | 8/2005 | Merrill | H01L 27/14647 257/291 |
| 7,105,373 B1 | 9/2006 | Hopper | |
| 7,838,955 B2 * | 11/2010 | Shim | H01L 27/14632 257/226 |

(Continued)

*Primary Examiner* — Jerome Jackson, Jr.
*Assistant Examiner* — Fang-Xing Jiang
(74) *Attorney, Agent, or Firm* — Treyz Law Group, P.C.; Andrew C. Milhollin; Joseph F. Guihan

(57) ABSTRACT

An image sensor with an array of pixels is provided. In order to achieve high image quality, it may be desirable to improve well capacity of individual pixels within the array. When forming each pixel, multiple n-type compartments having p-type isolation regions interposed between compartments may be formed. These compartments may have higher dopant concentrations due to lateral depletion that may occur within multiple PN-NP back to back junctions to assist full depletion at pinning-voltage. Compartments may allow distributing a moderately higher electric-field over a larger portion of the photodiode while lowering peak electric-fields that contribute to dark-current. Compartments will thereby improve the well capacity of the photodiode while preventing additional noise that may degrade the quality of the image signal. The quantity, doping, and depth of these compartments may be selected to maximize well capacity while minimizing effects on operating voltage, manufacturing cost, and power consumption.

8 Claims, 6 Drawing Sheets

(56) References Cited

U.S. PATENT DOCUMENTS 8,120,069 B2 2/2012 Hynecek
2005/0040445 A1 2/2005 Mouli
2008/0272449 A1* 11/2008 Inaba ................ H01L 27/14621
257/432

* cited by examiner

IMAGE SENSOR PIXELS WITH MULTIPLE COMPARTMENTS

BACKGROUND

This relates generally to image sensors, and more specifically, to the storage capacitance of photodiodes within image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

Image sensors often include a photodiode having a pinning-voltage which is a design parameter set by the doping levels of the photodiode. During normal operation, a photodiode node is first reset to the pinning-voltage using transistor circuitry. Then photons are allowed to enter the photodiode region for a pre-defined amount of time. The photons are converted to electrons inside the photodiode volume, and these electrons reduce the reset pinning-voltage. In this process, the maximum total charge stored, $Q_{MAX}$, is commonly referred to as the saturation full well (SFW) and depends on the well capacity of the photodiode. The actual charge stored, Q, is less than or equal to $Q_{MAX}$ based on the intensity and integration time of photons. When it is time to read out the stored signal, the stored charge Q at the photodiode node is transferred to a floating diffusion node through additional transistor circuitry. Pixel design should maximize the amount of charge Q that can be transferred from the photodiode to the floating diffusion node. If not, the charge spill back manifests as a loss to image quality. Maximum charge stored, $Q_{MAX}$, determines the highest signal level detected in the photodiode array. High $Q_{MAX}$ improves the dynamic range of an image sensor.

There are many sources of noise that may degrade the captured signal Q. Dark-current refers to electrons generated and captured by a photodiode from non-photon sources. Dark-current can originate from many sources including: Si defects due to implant & plasma damage, metallic contaminants in photodiode volume, avalanche and/or Zener high field electron-hole (e-h) pair generation, SRH e-h pair generation, trap related band-to-band-tunneling (BTBT), transfer gate induced BTBT on both photodiode and floating diffusion sides, and many others. In order to achieve high image quality, dark-current must be reduced. Lower dark-current improves signal to noise ratio (SNR) of the image sensor.

It would therefore be desirable to be able to achieve very high photodiode well capacity and very low dark current without sacrificing image quality.

DETAILED DESCRIPTION

Embodiments of the present invention relate to image sensors, and more particularly, to the storage capacitance of photodiodes within image sensors. It will be recognized by one skilled in the art, that the present exemplary embodiments may be practiced without some or all of these specific details. In other instances, well-known operations have not been described in detail in order not to unnecessarily obscure the present embodiments.

Figure 1:
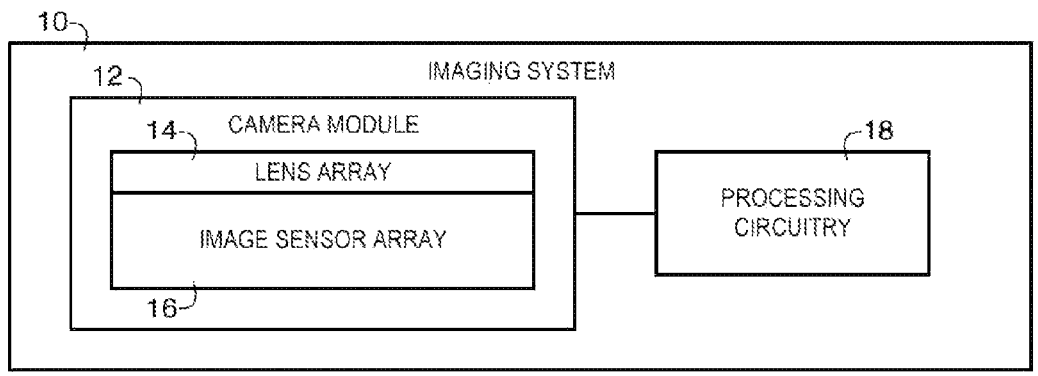
FIG. 1 is a diagram of an illustrative electronic device in accordance with an embodiment.

FIG. 1 is a diagram of an illustrative electronic device in accordance with an embodiment. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include an array of lenses 14 and a corresponding image sensor array 16. Lens array 14 and image sensor array 16 may be mounted in a common package and may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor array 16 or an integrated circuit within module 12 that is associated with image sensor array 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Image sensor array 16 may contain an array of individual image sensors configured to receive light of a given color by providing each image sensor with a color filter. The color filters that are used for image sensor pixel arrays in the image sensors may, for example, be red filters, blue filters, and green filters. Each filter may form a color filter layer that covers the image sensor pixel array of a respective image sensor in the array. Other filters such as white color filters, dual-band IR cutoff filters (e.g., filters that allow visible light and a range of infrared light emitted by LED lights), etc. may also be used.

Figure 2:
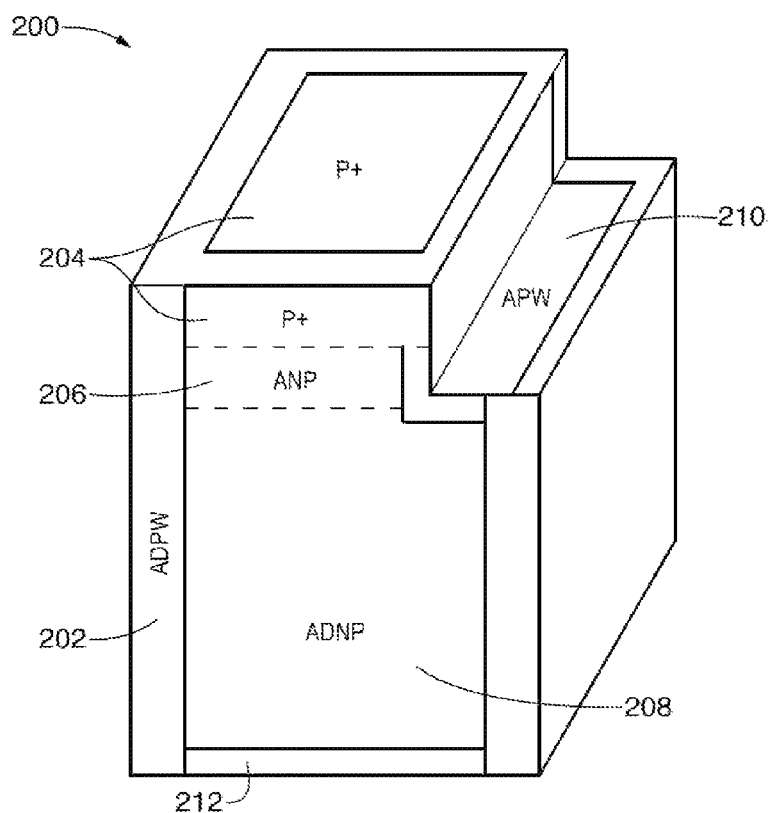
FIG. 2 is a simplified isometric view of a portion of an image sensor photodiode.

FIG. 2 is a simplified isometric view of a portion of an image sensor photodiode. As shown in FIG. 2, photodiode 200 may be constructed on a substrate and include a p-isolation 202 that surrounds the photodiode, a higher doped p-type layer 204 at the surface of the substrate, an n-type layer 206 that is formed directly below the p-type layer 204, a lower doped deep n-type region 208 that is formed directly below higher doped n-type region 206, a p-well 210, and an additional p-type region 212 that is formed below deep n-type region 208.

P-isolation 202 may extend at least as deep as the lightly doped deep n-type region 208 and may therefore sometimes be referred to as a deep p-well or an array deep p-type well (ADPW). P-type layer 204 may be heavily doped with p-type material and may therefore sometimes be referred to as a $P_+$ layer or P-pinning layer. N-type layer 206 may be heavily doped with n-type material and may therefore sometimes be referred to as an $N_+$ layer or an array n-type photodiode (ANP) layer. Deep n-type region 208 may be lightly doped and may extend at least as deep into the substrate as ADPW region 202 and may therefore sometimes be referred to as an array deep n-type photodiode (ADNP) layer. P-well 210 may sometimes be referred to as an array p-type well (APW). P-well 210 may sometimes include transistors for pixel operation. ADPW region 202, $P_+$ layer 204, APW region 210, and additional p-type region 212 interact with ANP layer 206 and ADNP region 208 to form a p-n junction. APW region 210 may be located in a corner of photodiode 200 and may house transistor circuitry and a floating diffusion node.

During operation, a pinning-voltage between 1V and 2V may be applied to photodiode 200 in order to completely deplete the p-n junction. Photons may then be permitted to enter photodiode 200 for a pre-defined amount of time. A majority of the photons that enter the photodiode may then generate electrons-hole pairs inside photodiode 200. Generated holes are collected by the p-isolation region and removed. Photodiode 200 may store an electron charge Q during this time period. The magnitude of charge that may be stored in photodiode 200 is limited by the SFW capacity of photodiode 200. The charge Q may then be transferred from photodiode 200 to a floating diffusion node with transistor circuitry.

Figure 3:
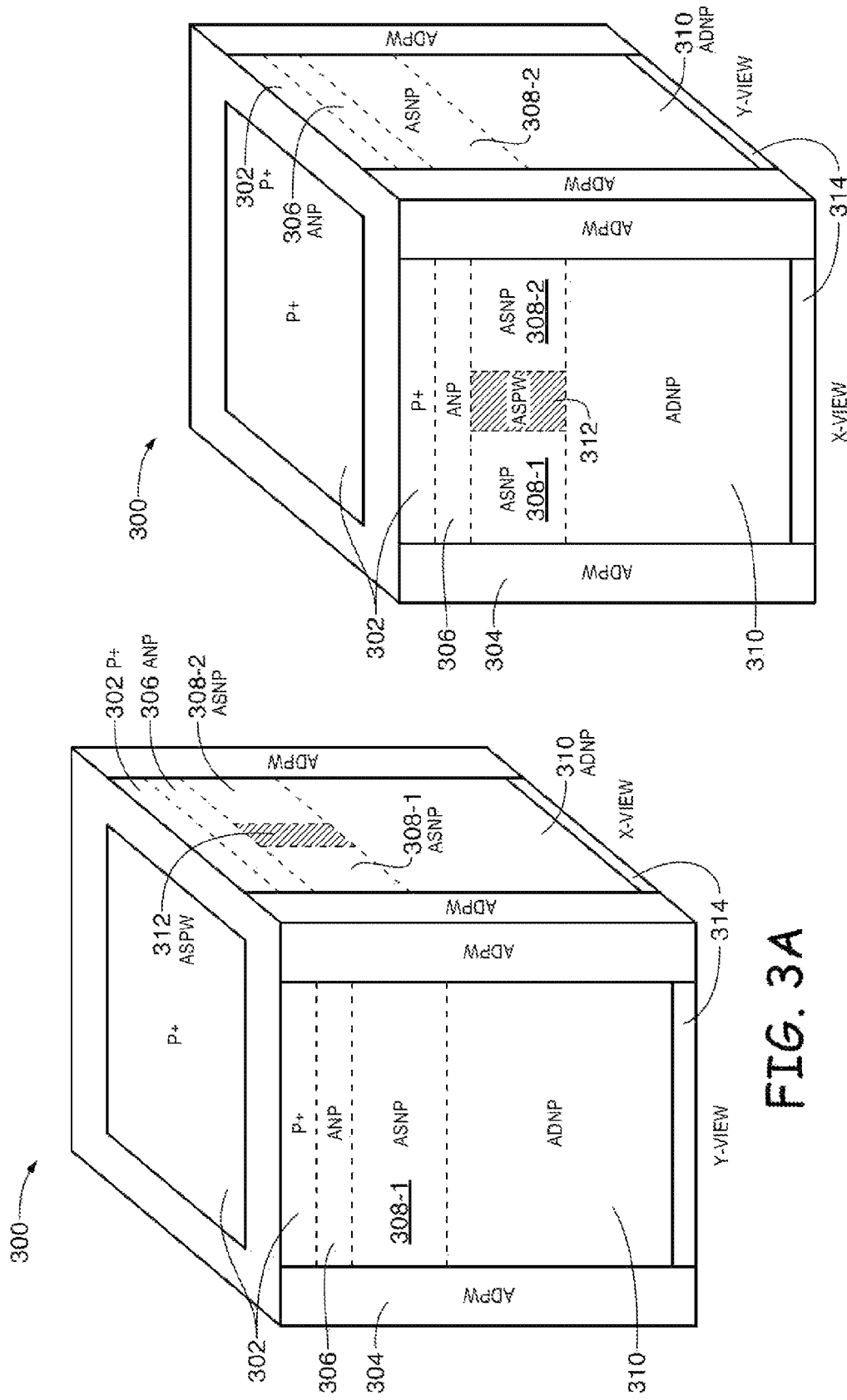
FIG. 3A is an isometric y-axis view of an illustrative image sensor photodiode showing a compartmental array shallow n-type photodiode (ASNP) region in accordance with an embodiment.
FIG. 3B is an isometric x-axis view of the illustrative image sensor photodiode of FIG. 3A in accordance with an embodiment.

FIGS. 3A and 3B are two isometric views of an illustrative image sensor photodiode showing a compartmental array shallow n-type photodiode region (ASNP) in accordance with an embodiment. FIG. 3A shows photodiode 300 from a y-axis perspective. FIG. 3B shows photodiode 300 from an x-axis perspective. As shown in FIGS. 3A and 3B, photodiode 300 may include a substrate, $P_+$ layer 302, ADPW region 304, ANP layer 306, n-type compartments 308-1 and 308-2, ADNP region 310, a p-well 312, and additional p-type region 314.

ADPW region 304 may be formed to surround photodiode 300 and may extend at least as deep as ADNP region 310. $P_+$ layer 302 may be formed at the surface of the substrate. ANP layer 306 may be formed directly below $P_+$ layer 302. N-type compartments 308-1 and 308-2 need not extend as deep into the substrate as ADNP region 310 and may therefore sometimes be referred to as array shallow n-type photodiode (ASNP) compartments. ASNP compartments 308-1 and 308-2 may be formed directly below ANP layer 306. P-well 312 may not extend as deep into the substrate as ADPW region 304 and may therefore sometimes be referred to as an array shallow p-type well (ASPW). ASPW region 312 may be interposed between ASNP compartments 308-1 and 308-2 and may be formed directly below ANP layer 306. ADNP region 310 may be located directly below ASPW region 312 and ASNP compartments 308-1 and 308-2. Additional p-type region 314 may be located directly below ADNP region 310, but may not be surrounded by ADPW region 304.

It should be noted that the geometries presented in FIGS. 3A and 3B are illustrative, and one familiar in the art will recognize how to incorporate this construction into many other complex 3D pixel geometries. It should be appreciated that the doping types presented in this embodiment may be reversed without deviating from the basic concept. Operation of photodiode 300 may be similar to the previously described operation of photodiode 200.

Figure 4:
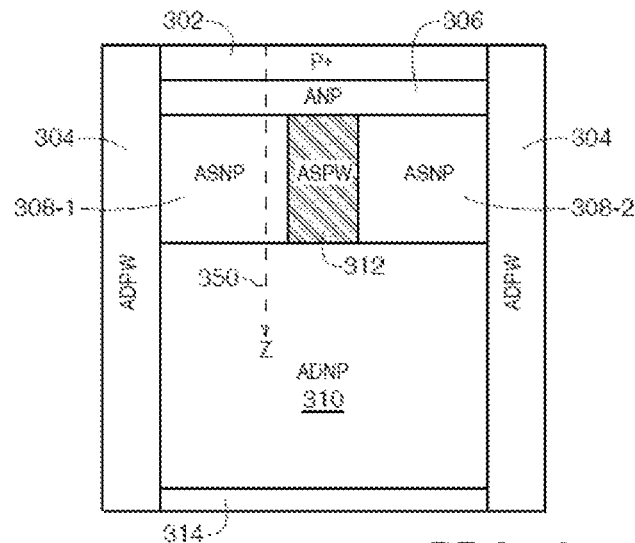
FIG. 4 is a cross-sectional side view of an illustrative image sensor photodiode showing a compartmental ASNP region having two compartments in accordance with an embodiment.

FIG. 4 is a cross-sectional side view of an illustrative image sensor photodiode showing a compartmental ASNP region having two compartments in accordance with an embodiment. As shown in FIG. 4, this cross-section may be taken from photodiode 300 from the perspective shown in FIG. 3B.

The doping level of ANP layer 306 may be optimized for vertical depletion such that, at the pinning-voltage, a one-sided depletion edge completely depletes the ANP thickness in the vertical direction. The doping level of the ADNP region may be optimized for lateral depletion such that, at the pinning-voltage, the constant longer y-dimension is fully depleted in the lateral direction. In the ADNP region, for symmetric pixels, this y-dimension is same as the x-dimension. ASNP compartments 308-1 and 308-2 may be optimized for lateral depletion such that, at the pinning-voltage, the shorter x-dimension is fully depleted in the lateral direction. It is understood that depletion is 3-dimensional, and only the main factor for depletion is described to illustrate the invention. In this way, there may be three total contributing factors to SFW capacity. The sum of the three may provide a much higher well capacity than that of the photodiode 200 of FIG. 2 without degrading the maximum vertical E-field at the $P_+$/ANP junction while operating at the pinning-voltage.

ASPW region 312 and ASNP compartments may extend from ANP layer 306 to a particular depth in z-direction 350. This depth may be customized to ensure full depletion at a particular pinning-voltage. This depth may be customized to simplify manufacturability & cost at a particular pinning-voltage. Additionally, this depth may be selected to allow significantly higher well capacity than that of photodiode 200 of FIG. 2 without degrading the maximum vertical E-field. Alternatively, this design consideration may be used to lower the maximum vertical E-field in order to minimize or eliminate dark-current due to trap assisted band to band tunneling that degrades dark current. This design may be used to both improve Dynamic Ratio and Signal-to-Noise Ratio of an image sensor.

The additional p-type region 314 may be formed either by ion implantation of p-type dopants or by inversion (e.g. deposition of fixed charge material adjacent to the bottom surface). In a back side illumination (BSI) configuration, additional p-type region 314 may become the ingress for photon entry.

Figure 5:
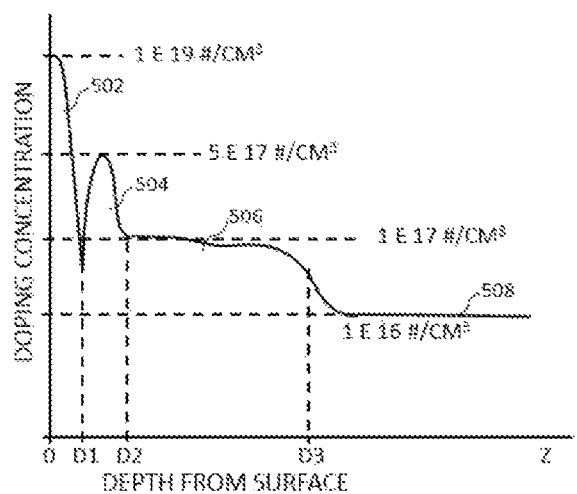
FIG. 5 is a graph plotting dopant concentration versus substrate depth in accordance with an embodiment.

FIG. 5 is a graph plotting dopant concentration versus substrate depth in accordance with an embodiment. As shown in FIG. 5, a nonlinear doping profile may be applied to a photodiode (e.g. the photodiode 300 in FIGS. 3A and 3B) into the substrate of the photodiode (e.g. in z-direction 350 in FIG. 4). This profile may illustrate the doping concentrations of various layers and regions of the photodiode such as photodiode 300 in FIGS. 3A and 3B. For example, p-type doping profile section 502 may relate to the doping concentration and thickness of $P_+$ layer 302; n-type doping profile section 504 may relate to the doping concentration and thickness of ANP layer 306; n-type doping profile section 506 may relate to the doping concentration and thickness of ASNP regions 308-1 and 308-2; and n-type doping profile section 508 may relate to the doping concentration and thickness of ADNP region 310. To provide adequate isolation, p-type doping profiles of ADPW and ASPW in the z-direction may be adjusted to be higher than the adjacent n-type doping levels.

Figure 6:
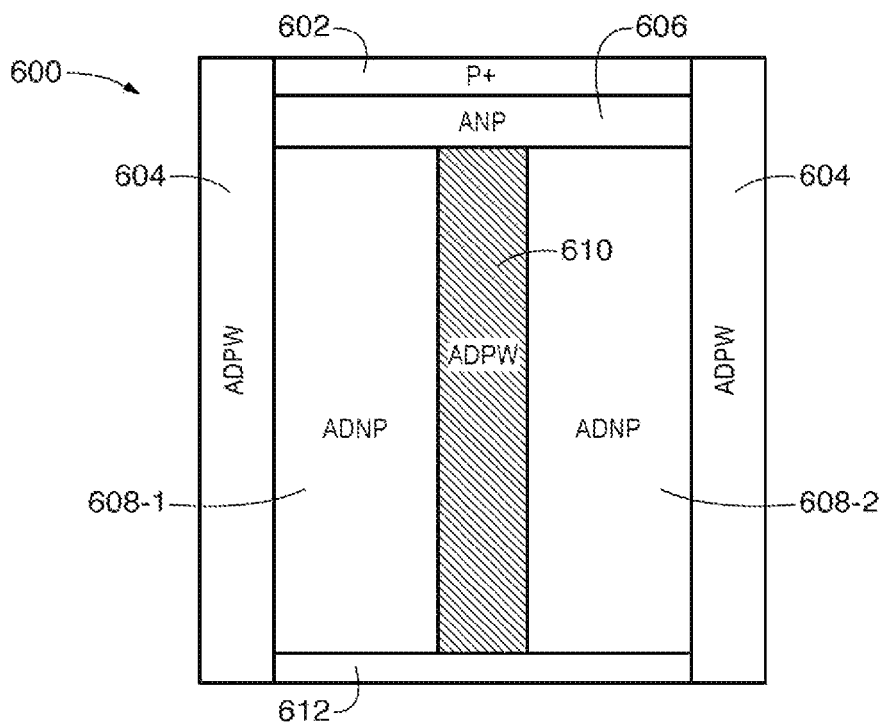
FIG. 6 is a cross-sectional side view of an illustrative image sensor photodiode showing an array deep photodiode well (ADPW) region and a compartmental ASNP region extending down the length of the photodiode in accordance with an embodiment.

FIG. 6 is a cross-sectional side view of an illustrative image sensor photodiode showing an array deep photodiode well (ADPW) region and a compartmental ASNP region extending down the length of the photodiode in accordance with an embodiment. As shown in FIG. 6, photodiode 600 may include $P_+$ layer 602, ADPW region 604, ANP layer 606, ADNP compartments 608-1 and 608-2, additional ADPW region 610, and additional p-type region 612. ADPW region 604 may be formed to surround photodiode 600. It should be noted that the geometries presented in FIG. 6 are illustrative, and one familiar in the art will recognize how to incorporate this construction into many other complex 3D pixel geometries. It should be appreciated that the doping types presented in this embodiment may be reversed without deviating from the basic concept. Operation of photodiode 600 may be similar to the previously described operation of photodiode 200.

ADNP compartments 608-1 and 608-2 may be optimized for lateral depletion when the pinning-voltage is applied. ANP region 606 may be optimized for vertical depletion when the pinning-voltage is applied. It should be noted that ADPW region 610 and ADNP compartments 608-1 and 608-2 may be formed to have PN-NP back to back junctions when under depletion. ADPW region 604 and ADPW region 610 may have similar or different doping levels.

ADPW region 610 and ADNP compartments 608-1 and 608-2 may be formed to extend in the z-direction from ANP 606 to additional p-type region 612. ADPW region 610 and ADNP compartment 608-1 and 608-2 may be formed to extend from a position below ANP 606 to a position above additional p-type region 612. By extending the ADNP compartments in such a way, photodiode 600 may produce higher LFW values compared to those of photodiode 300 (FIGS. 3A and 3B).

Figure 7:
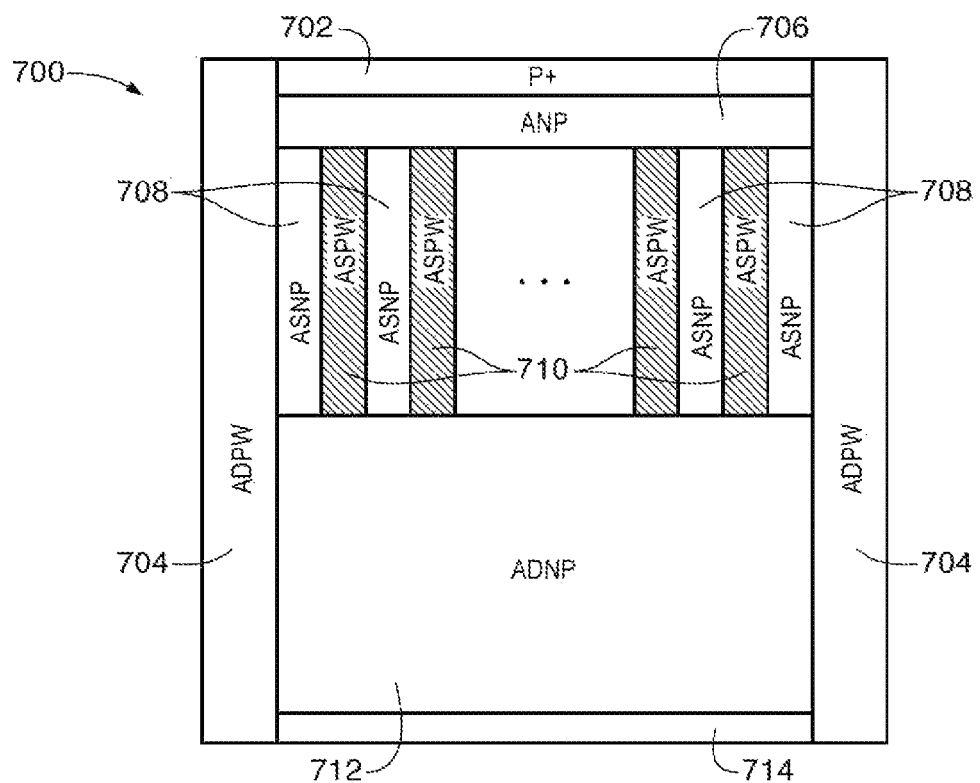
FIG. 7 is a cross-sectional side view of an illustrative image sensor photodiode showing a compartmental ASNP region having more than two compartments in accordance with an embodiment.

FIG. 7 is a cross-sectional side view of an illustrative image sensor photodiode showing a compartmental ASNP region having more than two compartments in accordance with an embodiment. As shown in FIG. 7, photodiode 700 may include $P_+$ layer 702, ADPW region 704, ANP layer 706, a plurality of ASNP compartments 708, a plurality of ASPW regions 710, ADNP region 712, and additional p-type region 714. ADPW region 704 may be formed to surround photodiode 700.

The plurality of ASNP compartments 708 and the plurality of ASPW regions 710 may be implemented in various ways. For example, three ASNP compartments 708 may be formed having two ASPW interposing wells 710 and three PN-NP junctions. In another illustrative embodiment, four ASNP compartments 708 may be formed having three ASPW interposing wells 710 and four PN-NP junctions. In yet another suitable embodiment, N ASNP compartments may be formed having (N-1) ASPW interposing wells 710 and N PN-NP junctions.

It should be noted that the geometries presented in FIG. 7 are illustrative, and one familiar in the art will recognize how to incorporate this construction into many other complex 3D pixel geometries. It should be appreciated that the doping types presented in this embodiment may be reversed without deviating from the basic concept. Operation of photodiode 700 may be similar to the previously described operation of photodiode 200.

The plurality of ASPW regions 710 may be formed in such a way as to isolate the plurality of ASNP regions 708 from one another. The plurality of ASPW regions 710 may be formed in such a way as to partially isolate the plurality of ASNP regions 708 from one another. Each of the plurality of ASNP regions 708 may be formed to have PN-NP back to back junctions with corresponding ASPW regions 710 when under depletion. By forming these additional junctions, the well capacity of photodiode 700 may be higher than that of photodiode 200 (FIG. 2).

Figure 8:
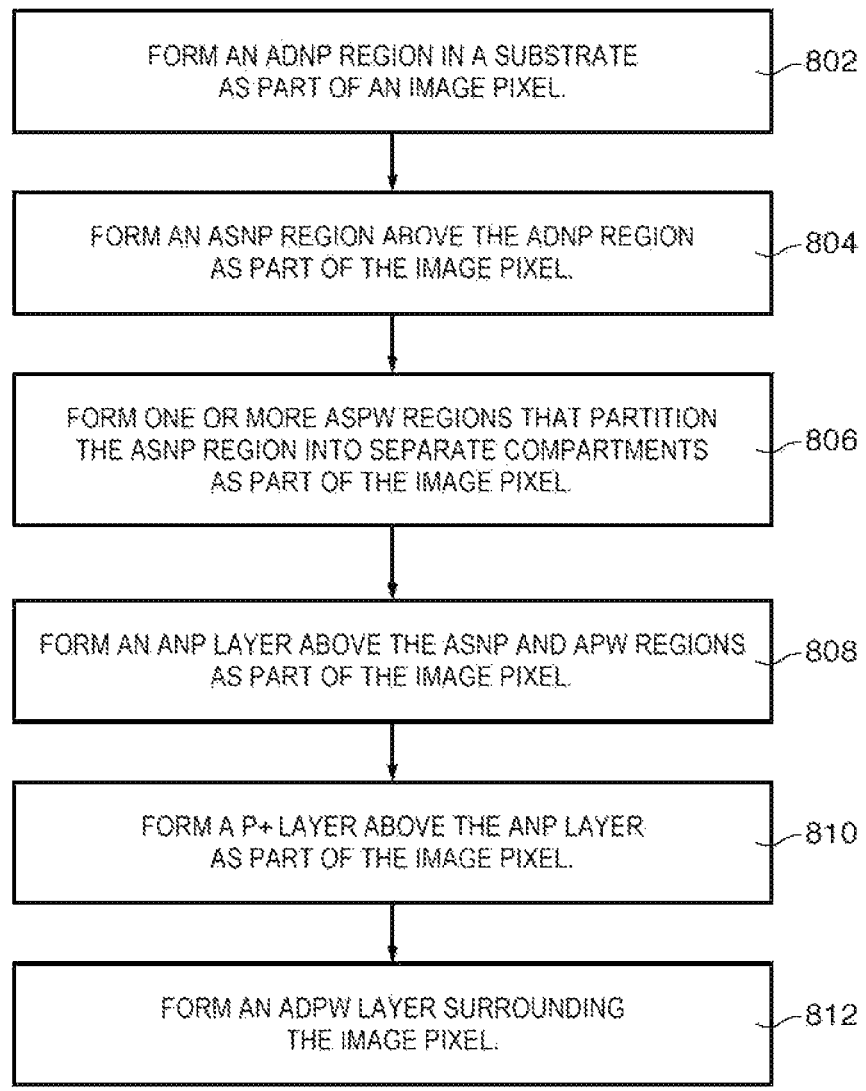
FIG. 8 is a flowchart of the illustrative steps involved in fabricating an image sensor photodiode having a compartmental ASNP region in accordance with an embodiment.

FIG. 8 is a flowchart of the illustrative steps involved in fabricating an image sensor photodiode having a compartmental ASNP region in accordance with an embodiment. Step 802 corresponds to the formation of an ADNP region (e.g. ADNP region 310 of FIG. 4). Step 804 describes the formation of an ASNP region above the ADNP region. Step 806 corresponds to the formation of one or more ASPW regions (e.g. ASPW region 312 of FIG. 4) that partition the ASNP region into separate compartments (e.g. ASNP compartments 308-1 and 308-2 of FIG. 4). Step 808 corresponds to the formation of an ANP layer (e.g. ANP layer 306 of FIG. 4) above the ASNP and APW regions. Step 810 corresponds to the formation of a $P_+$ layer (e.g. $P_+$ layer 302 of FIG. 4) above the ANP layer. Step 812 corresponds to the formation of an ADPW region (e.g. ADPW region 304 of FIG. 4) surrounding the image pixel. These regions may be formed by one or more ion-implantation processing steps with proper implant masking layers.

Figure 9:
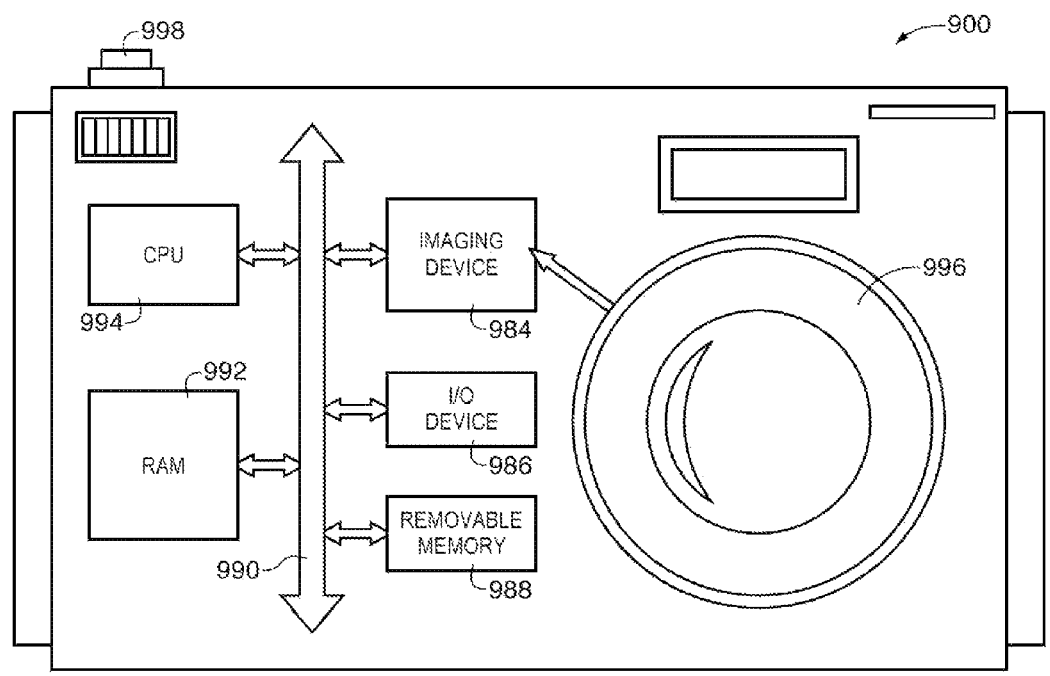
FIG. 9 is a block diagram of a processor system employing the image sensor photodiode of FIGS. 3A, 3B, 4, 6, and 7 in accordance with an embodiment.

FIG. 9 is a block diagram of a processor system employing the image sensor photodiode of FIGS. 3A, 3B, 4, 6, and 7 in accordance with an embodiment. Device 984 may comprise the elements of device 10 (FIG. 1) or any relevant subset of the elements. Processor system 900 is exemplary of a system having digital circuits that could include imaging device 984. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 900, which may be a digital still or video camera system, may include a lens or multiple lenses indicated by lens 996 for focusing an image onto an image sensor array or multiple image sensor arrays such as image sensor array 16 (FIG. 1) when shutter release button 998 is pressed. Processor system 900 may include a central processing unit such as central processing unit (CPU) 994. CPU 994 may be a microprocessor that controls camera functions and one or more image flow functions and communicates with one or more input/output (I/O) devices 986 over a bus such as bus 990. Imaging device 984 may also communicate with CPU 994 over bus 990. System 900 may include random access memory (RAM) 992 and removable memory 988. Removable memory 988 may include flash memory that communicates with CPU 994 over bus 990. Imaging device 984 may be combined with CPU 994, with or without memory storage, on a single integrated circuit or on a different chip. Although bus 990 is illustrated as a single bus, it may be one or more buses or bridges or other communication paths used to interconnect the system components.

Various embodiments have been described illustrating image sensor pixels that include two or more n-type compartments isolated by p-type material and configured to form multiple laterally depleting P-N junctions. The n-type compartments may extend through the depth of the photodiode to maximize the area of the lateral depletion junctions. The photodiode may contain at least two n-type compartments, or may contain more than two compartments in order to create additional laterally depleting P-N junctions.

An image sensor pixel may include a p-type layer, first and second n-type regions formed below the p-type layer, and a p-type region that is interposed between the first and second n-type regions. The image sensor pixel may include a third n-type region formed below the p-type region and the first and second n-type regions. If desired, the third n-type region may be formed with a uniform doping profile. The first and second n-type regions may have a higher doping concentration than the third n-type region.

The image sensor may include an additional p-type region that surrounds the p-type layer, the first and second n-type regions, and the third n-type region. The image sensor may include an n-type layer formed between the p-type layer and the first and second n-type regions. If desired, instead of forming the third n-type region, the p-type region and the first and second n-type regions may extend vertically from the n-type layer to the additional p-type region.

If desired, instead of forming the first and second n-type regions and the p-type region, a single n-type region may be formed and multiple p-type regions may be interposed in the single n-type region to form multiple n-type compartments.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
    a p-type layer;
    an n-type layer formed below the p-type layer;
    first and second n-type regions formed below the n-type layer;
    a p-type region that is interposed between the first and second n-type regions, wherein the n-type layer, the first and second n-type regions, and the p-type region form a photodiode for the image sensor pixel; and
    a third n-type region formed below the p-type region and the first and second n-type regions, wherein the first and second n-type regions have a doping concentration that is higher than the doping concentration of the third n-type region.

2. The image sensor pixel defined in claim 1, wherein the third n-type region forms an additional portion of the photodiode.

3. An image sensor pixel, comprising:
    a p-type layer;
    an n-type layer formed below the p-type layer;
    first and second n-type regions formed below the n-type layer;
    a p-type region that is interposed between the first and second n-type regions, wherein the n-type layer, the first and second n-type regions, and the p-type region form a photodiode for the image sensor pixel;
    a third n-type region formed below the p-type region and the first and second n-type regions; and
    an additional p-type region that surrounds the p-type layer, the first and second n-type regions, and the third n-type region.

4. The image sensor pixel defined in claim 3, wherein the n-type layer has a doping profile that is optimized for vertical depletion.

5. A system, comprising:
    a central processing unit;
    memory;
    a lens;
    input-output circuitry; and
    an imaging device, wherein the imaging device comprises:
    an array of pixels arranged in rows and columns, with each pixel comprising a photodiode, wherein each photodiode comprises:
    a p-type layer;
    an n-type layer formed below the p-type layer;
    an n-type region formed below the n- type layer; and
    at least one p-type region that partitions a portion of the n-type region into at least two separate compartments, wherein each photodiode in the array further comprises at least one other p-type region that partitions the n-type region into at least three separate n-type compartments, and an additional n-type region formed below the at least one p-type region and the n-type region;
    wherein the n-type region exhibits a doping concentration that is higher than that of the additional n-type region.

6. The system of claim 5, wherein the additional n-type region exhibits a uniform doping profile.

7. The system defined in claim 5, wherein each photodiode in the array is surrounded by an additional p-type region.

8. The system defined in claim 7, wherein the n-type layer has a doping profile that is optimized for vertical depletion.

* * * * *